United States Patent
Ma et al.

(10) Patent No.: US 6,573,822 B2
(45) Date of Patent: Jun. 3, 2003

(54) TUNABLE INDUCTOR USING MICROELECTROMECHANICAL SWITCHES

(75) Inventors: Qing Ma, San Jose, CA (US); Peng Cheng, Campbell, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/884,738

(22) Filed: Jun. 18, 2001

(65) Prior Publication Data

US 2002/0190835 A1 Dec. 19, 2002

(51) Int. Cl.[7] .................................................. H01F 5/00
(52) U.S. Cl. ........................ 336/223; 336/200; 336/87; 336/73
(58) Field of Search ................................ 336/200, 223, 336/87, 73

(56) References Cited

U.S. PATENT DOCUMENTS

| 5,808,527 | A | * | 9/1998 | Santos ......................... 333/205 |
| 5,880,921 | A | * | 3/1999 | Tham et al. ................... 361/233 |
| 6,202,495 | B1 | * | 3/2001 | Zavracky et al. ......... 73/862.639 |
| 6,232,847 | B1 | * | 5/2001 | Marcy .......................... 331/167 |
| 6,236,297 | B1 | * | 5/2001 | Chou et al. .................. 336/200 |

* cited by examiner

*Primary Examiner*—Anh Mai
(74) *Attorney, Agent, or Firm*—Blakely, Sokoloff, Taylor & Zafman LLP

(57) ABSTRACT

A tunable inductor is disclosed. The tunable inductor comprises a helical or spiral inductor formed on a semiconductor substrate having an input and an output. The helical inductor has a full length that provides a full inductance. Also, a full inductance switch is disposed between the output and the full length of the helical inductor. Finally, at least one microelectromechanical (MEMS) switch is disposed between the output and an intermediate location of the helical inductor.

17 Claims, 27 Drawing Sheets

TUNABLE INDUCTOR USING MICROELECTROMECHANICAL SWITCHES

TECHNICAL FIELD OF THE INVENTION

The present invention relates generally to integrated circuit inductors, and more particularly, to an inductor that is tuned using microelectromechanical (MEMS) switches.

BACKGROUND OF THE INVENTION

On-chip inductors are used in many integrated circuit applications, such as for filtering and power regulation. For example, inductors are required in miniaturized devices that may include a power regulator in an integrated circuit, or a component in a low power application such as a hand-held device. In some applications, the inductor may need to be tunable, i.e., the inductance of the inductor capable of being selectively modified. In other applications, the value of the inductance needed may be high. Currently, these requirements for a tunable high value inductance inductor have not been adequately met.

DETAILED DESCRIPTION OF THE INVENTION

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

The present invention comprises using MEMS switches to form tunable inductors. The inductors may be either helical or spiral inductors. Both the helical and spiral inductor formation process, patterning thereof may be done while forming the at least two electrically conductive layers. A helical inductor may be classified as a substantially 3-dimensional structure, whereas a spiral inductor is a substantially 2-dimensional structure.

The following figures illustrate various views of the present invention. However, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

Figure 1:
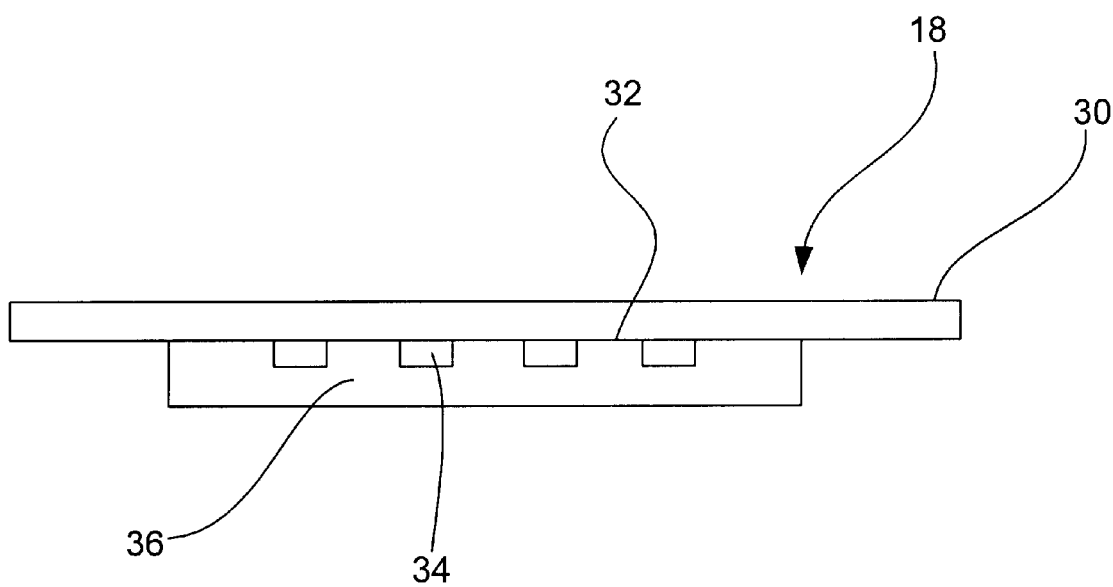
FIG. 1 is an elevational cross-section view of a semiconductor structure that illustrates a portion of the inventive process.

The present invention includes a packaging technology that fabricates build-up layers (BULS) on a substrate that includes a packaged microelectronic device. The substrate has an expanded area larger than that of the microelectronic device. As shown in FIG. 1, a device 36 is provided with a film 30 that is abutted against a device active surface 32 (also referred to herein as front active surface 20) to protect device 36. Device active surface 32 has at least one electrical contact 34 disposed thereon. The electrical contact 34 makes connection with integrated circuitry within device 36. The film 30 is preferably a substantially flexible material, such as Kapton® polyimide film (E. I. du Pont de Nemours and Company, Wilmington, Del.), but may be made of any appropriate material, including metallic films. The film 30 may have a weak, thermally stable adhesive, such as silicone, which attaches to device active surface 32. This adhesive-type film may be applied prior to placing device 36 in a mold or other such equipment used for the encapsulation process. Film 30 may also be a non-adhesive film, such as an ETFE (ethylene-tetrafluoroethylene) or Teflon® film, which is held on device active surface 32 by an inner surface of the mold or other such equipment during the encapsulation process.

Figure 2:
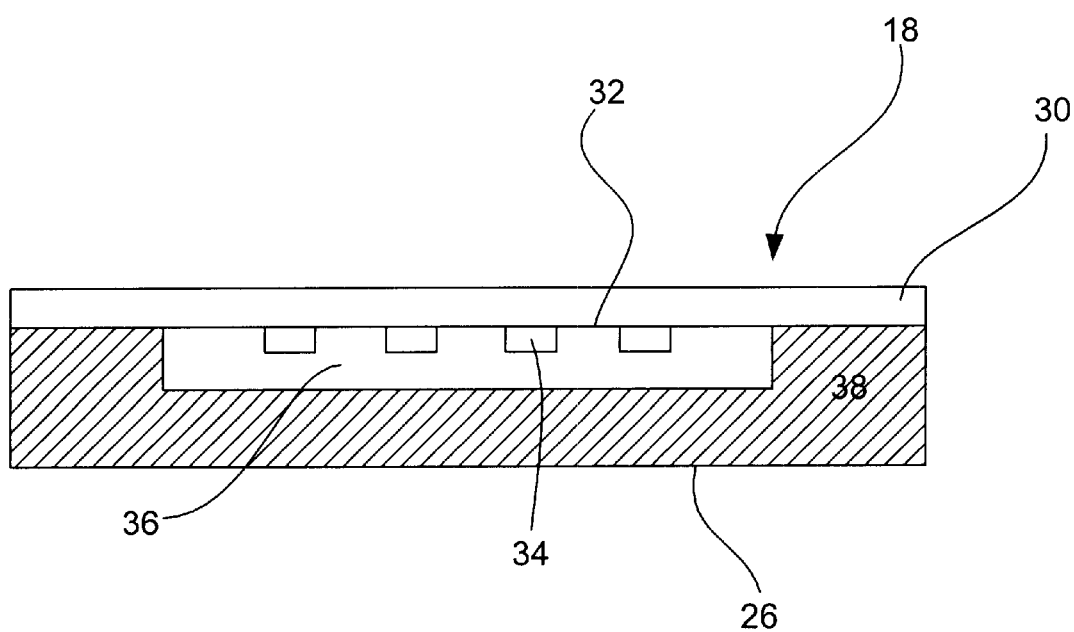
FIG. 2 is an elevational cross section view of the semiconductor structure depicted in FIG. 1 after further processing to encapsulate a device.

The device 36 is encapsulated with an encapsulation material 38, such as plastics, resins, epoxies, and the like, as shown in FIG. 2, that forms a back surface 26 of an integrated package. The encapsulation of the device 36 may be achieved by any known process, including but not limited to transfer and compression molding, and dispensing. The encapsulation material 38 provides mechanical rigidity, protects device 36 from contaminants, and provides surface area for the build-up of trace layers.

Figure 3:
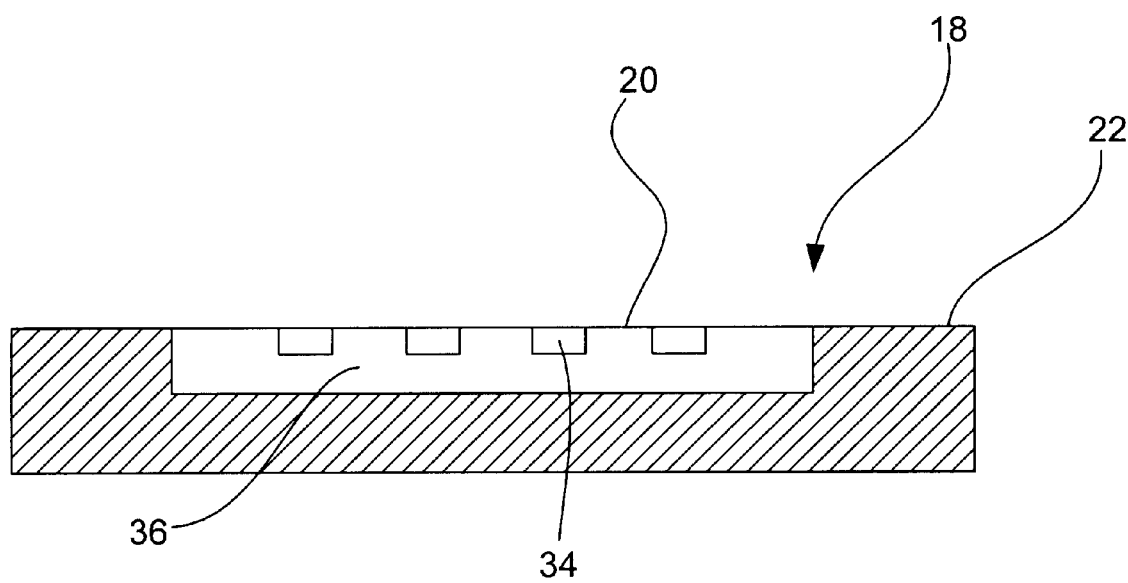
FIG. 3 is an elevational cross section view of the semiconductor structure depicted in FIG. 2 after further processing to expose active and inactive front surfaces.

Film 30 is removed, as shown in FIG. 3, to expose front active surface 20 and to form at least a front inactive surface 22 which may be substantially co-planar to front active surface 20. Front inactive surface 22 and front active surface 20 constitute the front surface of the encapsulated microelectronic die assembly, which will be utilized in further fabrication processes as additional surface area for the formation of BULs, such as dielectric material layers and conductive traces to form metallization and an inductor by the inventive process.

Figure 4:
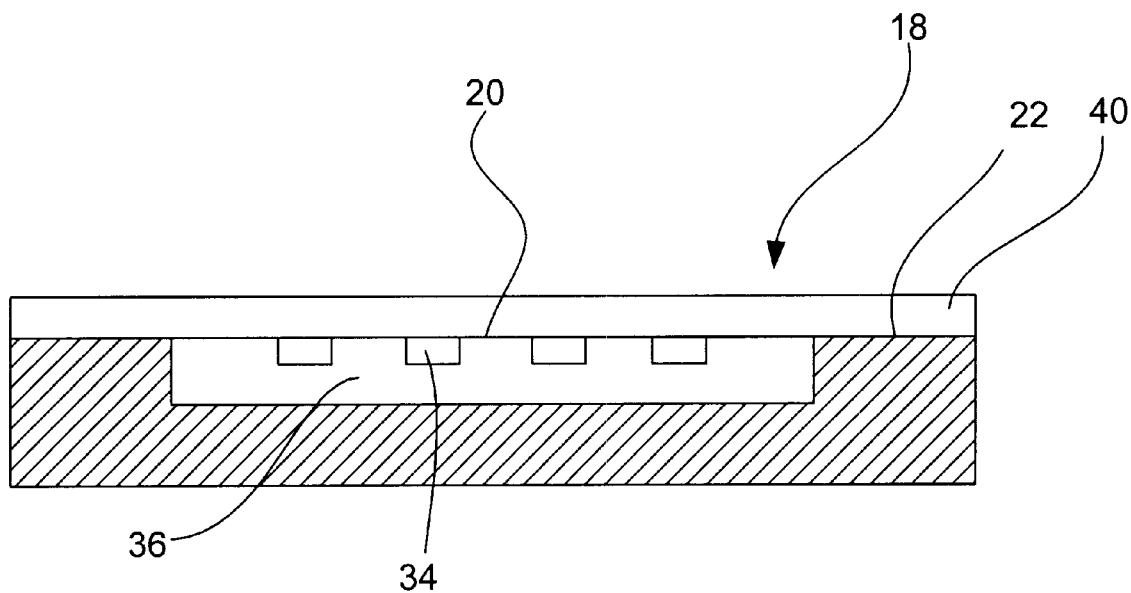
FIG. 4 is an elevational cross section view of the semiconductor structure depicted in FIG. 3 after further processing to form a first dielectric layer.

A first dielectric layer 40, such as epoxy resin, polyimide, bisbenzocyclobutene, and the like, is disposed over front active surface 20, electrical contacts 34, and front inactive surface 22, as shown in FIG. 4. The dielectric layers of the present invention are preferably filled epoxy resins available from Ibiden U.S.A. Corp., Santa Clara, Calif., U.S.A. and Ajinomoto U.S.A., Inc., Paramus, N.J., U.S.A. The formation of first dielectric layer 40 may be achieved by any known process, including but not limited to chemical vapor deposition, film lamination, spin coating, roll-coating, and spray-on deposition.

Figure 5:
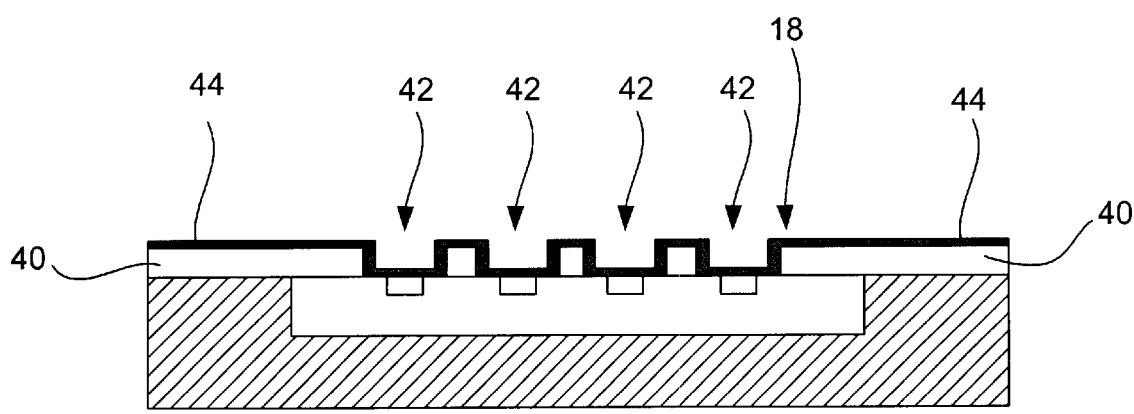
FIG. 5 is an elevational cross section view of the semiconductor structure depicted in FIG. 4 after further processing to form a first via and an optional seed layer.

As shown in FIG. 5, a first via 42 is formed through first dielectric layer 40. First via 42 may be formed by any method known in the art, including but not limited to laser drilling, photolithography, and, if first dielectric layer 40 is photoactive, forming first via 42 in the same manner that a photoresist mask is made in a photolithographic process, as known in the art. An exemplary semi-additive plating technique can involve depositing a first seed layer 44 on first dielectric layer 40, as seen in FIG. 5. First seed layer 44 may be formed by processes such as sputter-deposited or electroless-deposited metal, and may be a material such as such as a titanium/copper alloy.

Figure 6:
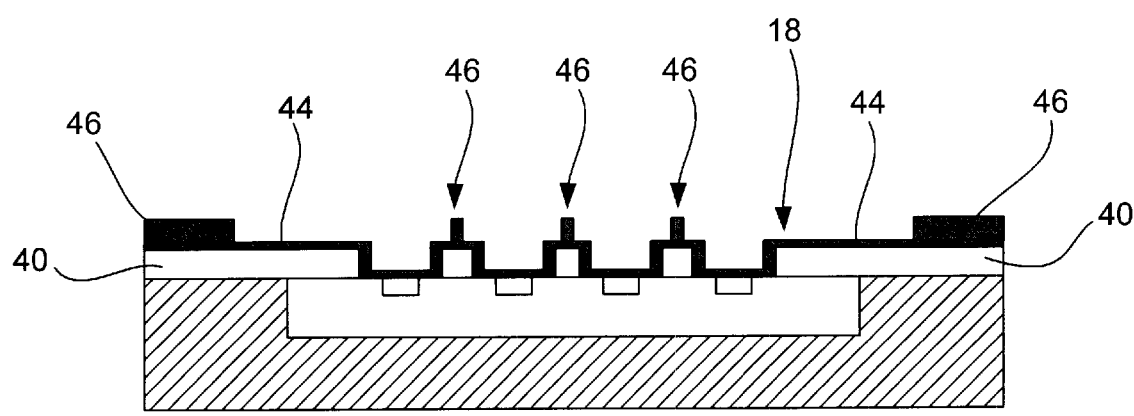
FIG. 6 is an elevational cross section view of the semiconductor structure depicted in FIG. 5 after further processing to pattern a mask.
Figure 7:
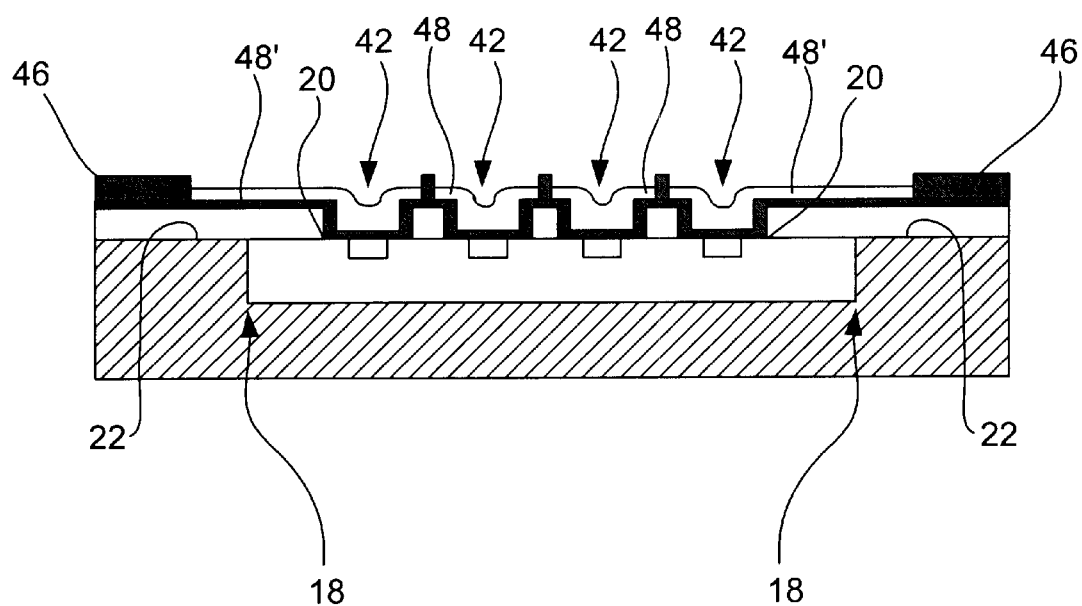
FIG. 7 is an elevational cross section view of the semiconductor structure depicted in FIG. 6 after further processing to form a first electrical trace.

FIG. 6 illustrates the formation of a first mask 46. First mask 46 is patterned on first seed layer 44 if it is present. Any number of processes may be used to form a trace in first via 42. One example is electrolytic plating of a layer of metal, such as copper, on first seed layer 44 exposed by open areas in first mask 46. A first conductive trace 48 is formed over first dielectric layer 40 and optional first seed layer 44, as shown in FIG. 7, wherein a portion of each of first conductive trace 48 extends into at least one of first via 42 to make electrical contact therewith. First conductive trace 48 may be made of any applicable conductive material, such as copper, aluminum, and alloys thereof. As shown in FIG. 7, at least one first conductive trace 48' extends across boundary 18 to be in contact with both front active surface 20 and front inactive surface 22. First conductive trace 48' is defined as a conductive trace that extends across boundary 18 and that may become a first level of an inductor structure. First conductive trace 48, 48' may be formed by any known technique, including but not limited to semi-additive plating and photolithographic techniques.

Figure 8:
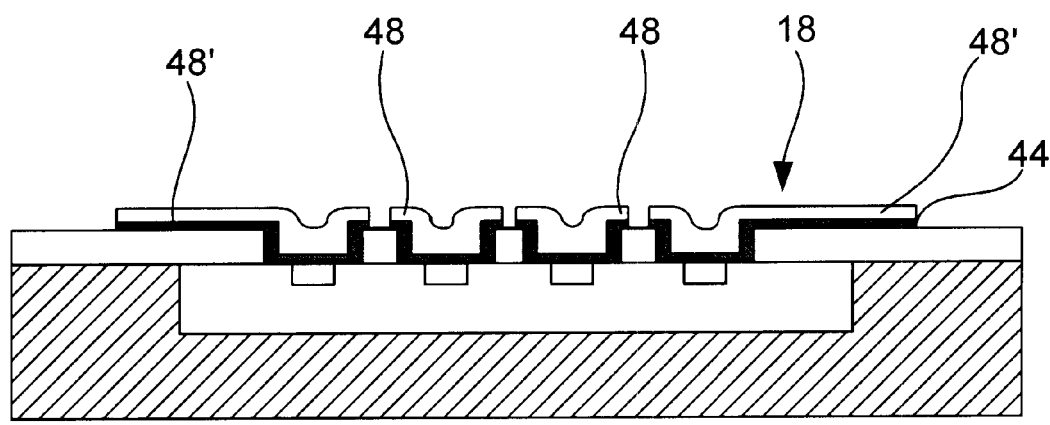
FIG. 8 is an elevational cross section view of the semiconductor structure depicted in FIG. 7 after further processing to remove excess material.

Following the formation of first conductive traces 48, 48', first mask 46 is stripped and portions of first seed layer 44 not having first conductive trace 48 disposed thereon are etched away as illustrated in FIG. 8. Other methods of forming first conductive trace 48 will be apparent to those skilled in the art.

Figure 9:
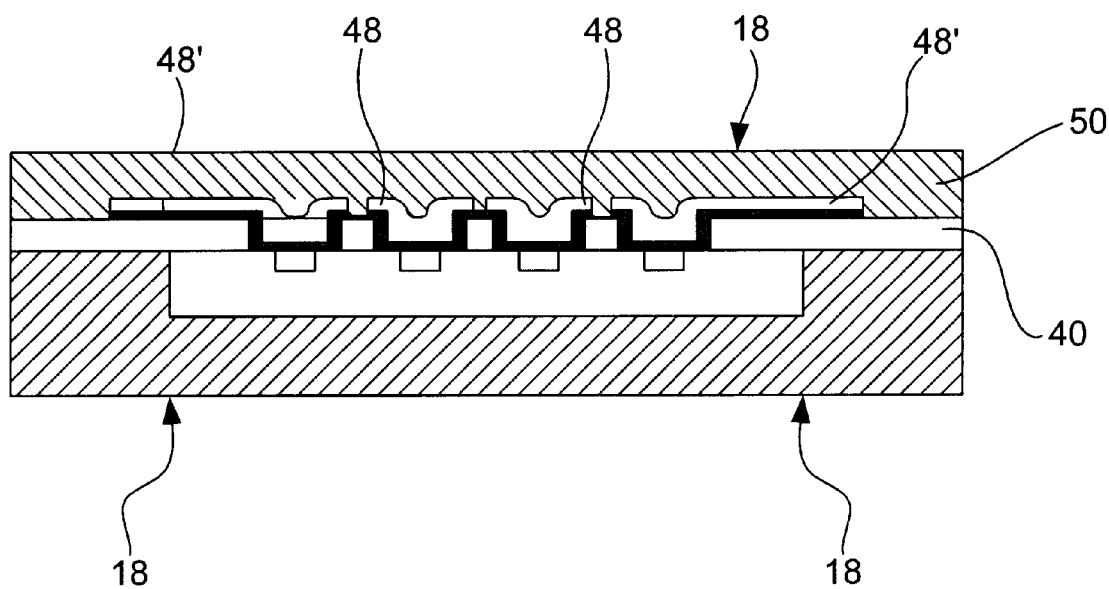
FIG. 9 is an elevational cross section view of the semiconductor structure depicted in FIG. 8 after further processing to form a second dielectric layer.

As shown in FIG. 9, a second dielectric layer 50 is formed over first conductive trace 48, 48' and first dielectric layer 40. The formation of second dielectric layer 50 may be achieved by any known process, including but not limited to film lamination, spin coating, roll coating and spray-on deposition and as set forth herein.

Figure 10:
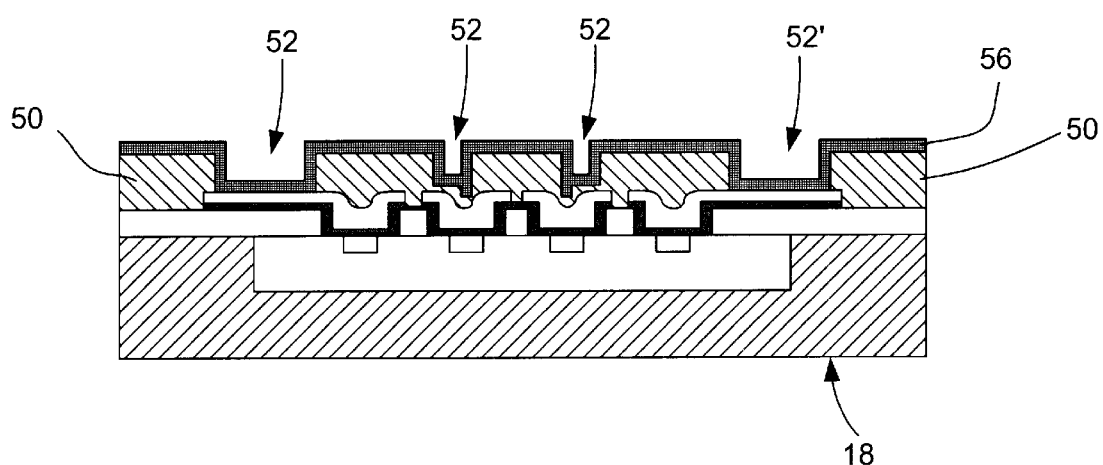
FIG. 10 is an elevational cross section view of the semiconductor structure depicted in FIG. 9 after further processing to form a second via and an optional second seed layer.

As shown in FIG. 10, a second via 52 is formed through second dielectric layer 50. Second via 52 may be formed by any method known in the art, including but not limited to laser drilling. If second dielectric layer 50 is photoactive, forming of second via 52 may be done in the same manner that a photoresist mask is made in a photolithographic process, as known in the art. Additionally, second via 52' is understood to be an opening into which at least a vertical or middle portion of an inductor can be formed.

The layering of dielectric layers and the formation of conductive traces can be repeated until the vias are in an appropriate position. Thus, portions of a single conductive trace be formed from multiple portions thereof and can reside on different dielectric layers.

Figure 11:
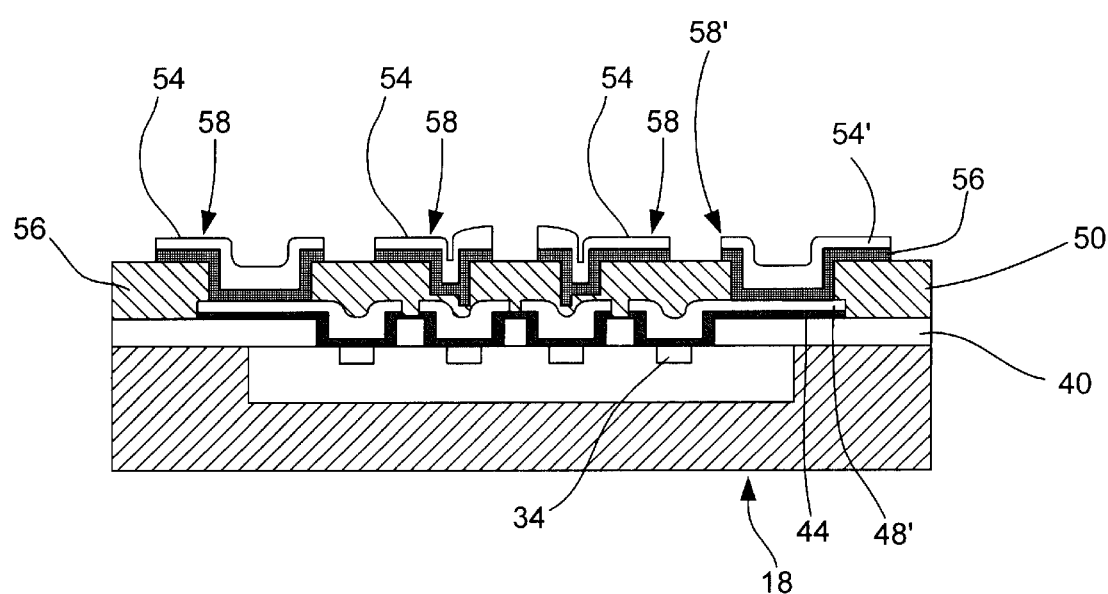
FIG. 11 is an elevational cross section view of the semiconductor structure depicted in FIG. 10 after further processing to form a second electrical trace and to complete an inductor structure.

A second conductive trace 54 and 54' may be formed as illustrated in FIG. 11, wherein a portion of each second conductive trace 54 extends into at least one of second via 52 or 52'. Additionally a second seed layer 56 may be formed in second via 52 and 52' similar to the manner of formation of first seed layer 44. Second conductive trace 54 each optionally include a landing pad 58. According to the inventive process, landing pad 58' portion of second conductive trace 54' may comprise an upper portion of an inductor as will be discussed further. According to the present invention, an inductor has been fabricated from several elements. These elements include the combination of the optional first seed layer 44 as it extends across boundary 18, first conductive trace 48', the optional second seed layer 56 as it extends across boundary 18, and second conductive trace 54'. The structure of the inductor will be further illustrated herein.

Regarding pin-out leads for the entire integrated package, they may be formed simultaneously with the inductor or semi-simultaneously as set forth herein. Once second conductive trace 54 and landing pad 58 are formed, they can be used in the formation of conductive interconnects or other structures. As such an optional third seed layer and a third conductive trace may be formed according to the inventive process. However, for the inventive process of forming an inductor, second conductive trace 54' and landing pad portion 58' may comprise a middle portion and an upper portion of an inductor. Alternatively, the second conductive trace 54' may have a substantially vertical post shape that comprises a middle portion of an inductor, and a third conductive trace with an optional third seed layer may be connected to comprise an upper portion of an inductor according to the present invention.

Figure 12:
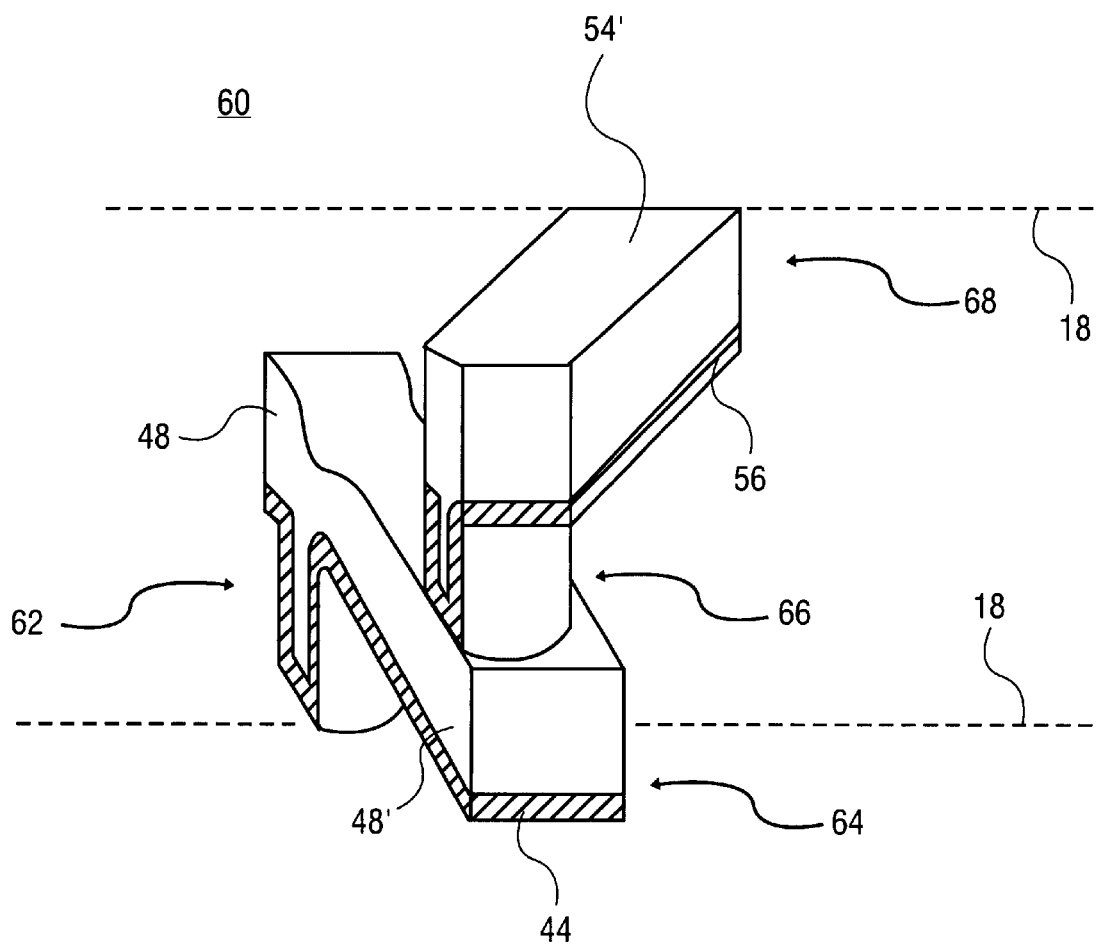
FIG. 12 is an elevational oblique view that illustrates a unit cell of a helical inductor.

FIG. 12 is an elevational oblique view that illustrates a unit cell 60 of a helical inductor that is made according to the present invention. FIG. 12 is also partially cut away to reveal an optional layered structure therein. Additionally, for the unit cell 60 depicted in FIG. 12, approximate boundary 18 intersections with unit cell 60 are set forth. A portion of first seed layer 44 and first conductive trace 48 forms a first filled via 62 (the filled via being first via 42) that connects to a contact 34 as illustrated in FIG. 11. Another portion of first seed layer 44 and first conductive trace 48' forms a lower coil portion 64 that may be a substantially right rectangular body. A middle coil portion 66 is a substantially vertically oriented shape that includes structure from second seed layer 56 and second conductive trace 54'. Additionally, an upper coil portion 68 may be a substantially right rectangular body that includes structure from second seed layer 56 and second conductive trace 54'.

Figure 13:
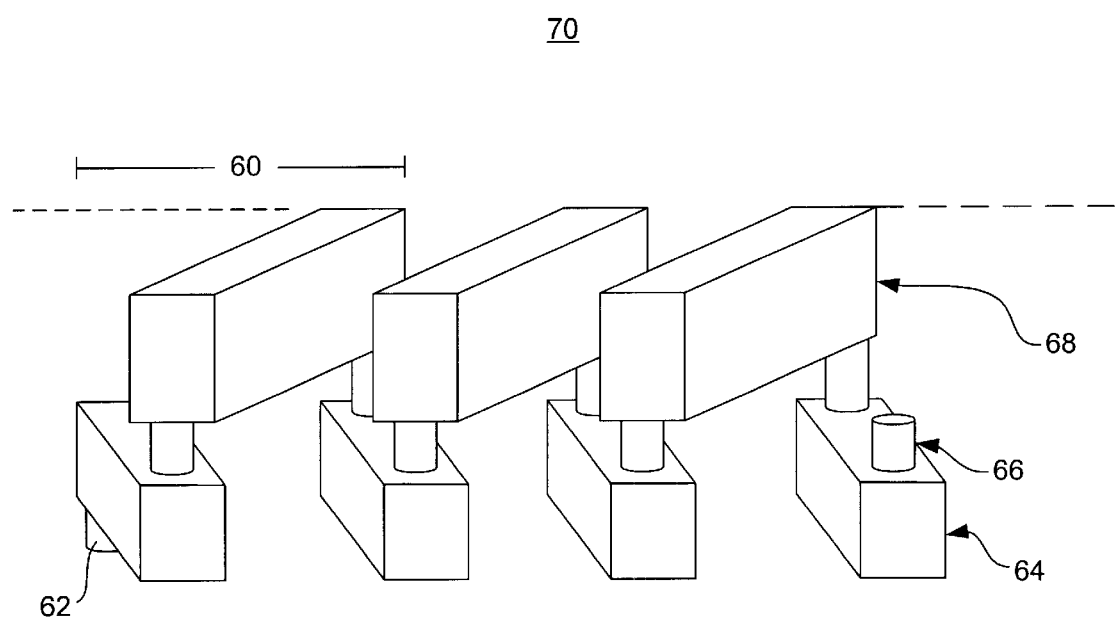
FIG. 13 is an elevational oblique view that illustrates a helical inductor.
Figure 15:
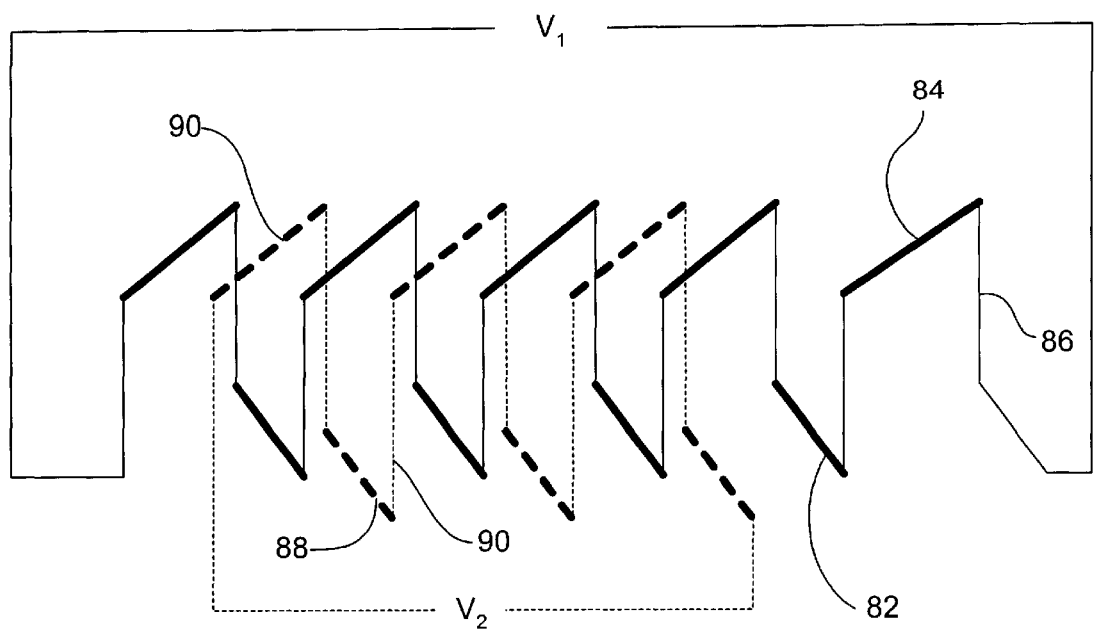
FIG. 15 is an elevational oblique schematic view of a transformer that comprises two interwound coils that are made according to the present invention.

FIG. 13 illustrates a helical inductor 70 that is made up of a plurality of unit cells 60. It is understood that helical inductor 70 includes first conductive trace 48' and second conductive trace 54'. It may include first seed layer 44 and second seed layer 56. As such, helical inductor 70 is made up of lower coil portion 64, middle coil portion 66, and upper coil portion 68. FIG. 15 also illustrates the presence of first filled via 62 where first filled via 62 represents a terminal end of helical inductor 70.

Figure 14:
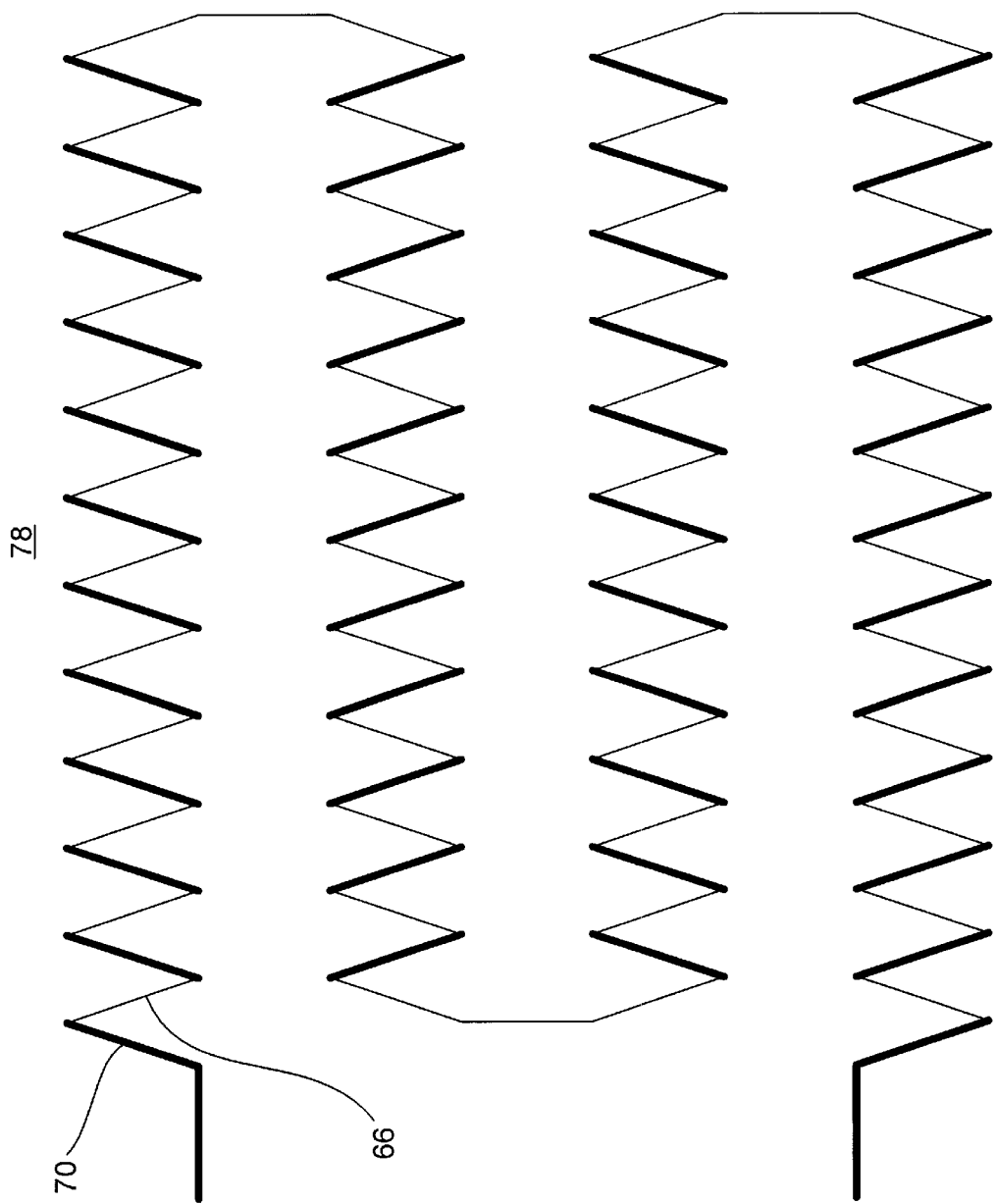
FIG. 14 is a top plan view of a folded helical inductor according to present invention.

FIG. 14 is a top plan schematic view of a folded helical inductor 78 where the light lines represent lower coil portion 64 and the heavy lines represent upper coil portion 68. Folded inductor 78 is fabricated according to the present invention during BUL processing as set forth herein.

FIG. 15 is an elevational oblique schematic view of a transformer 80 that uses interwound coils that are fabricated according to the present invention. As depicted, the heavy solid lines represent lower 82 and upper 84 sections of a first helix, and the light solid lines represent middle sections 86 of the first helix. Further, the heavy dashed lines represent lower 88 and upper 90 sections of a first interwound helix, and the light dashed lines represent middle sections 92 of the second interwound helix. The ratio of the number of turns between the first and second helix determine the voltage ratio V1 and V2.

Figure 16:
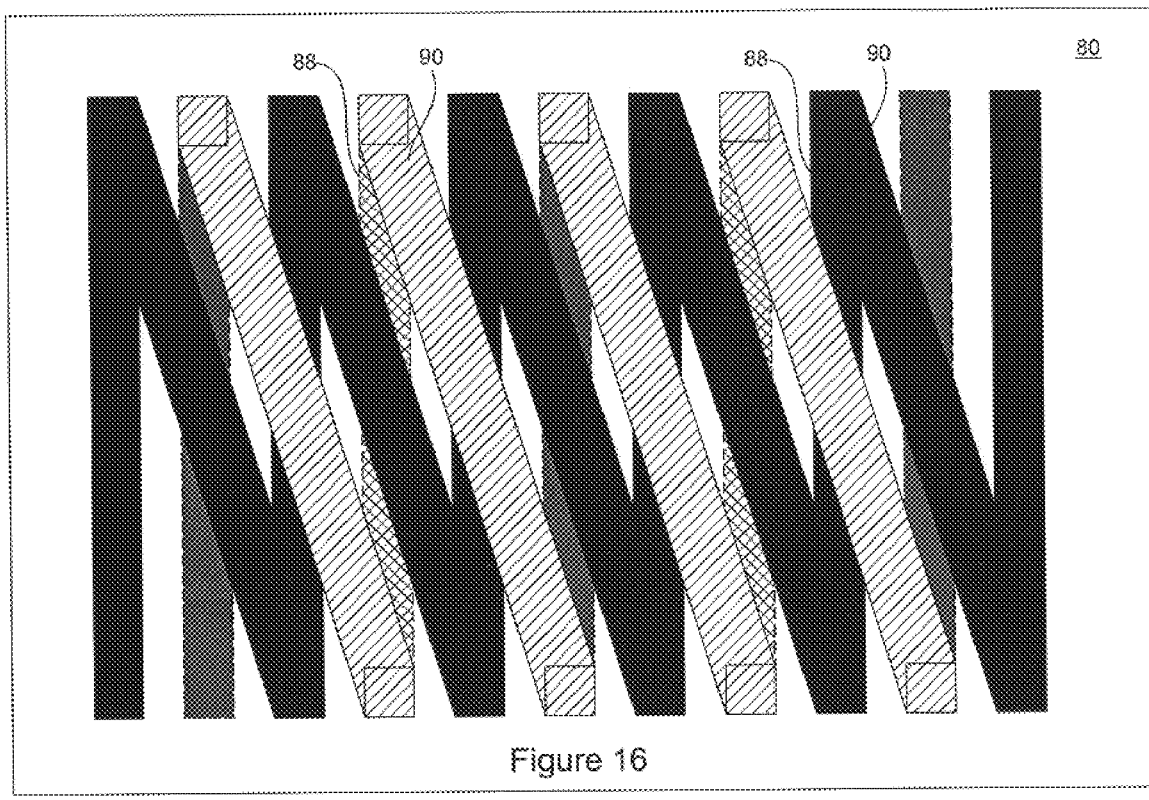
FIG. 16 is a top plan view of a transformer.

FIG. 16 illustrates a top plan view of transformer 80. Again, the solid lines represent lower 82 and upper 84 sections of a first helix and the heavy cross-hatched lines represent lower 88 and upper 90 sections of a first interwound helix. Spacing between the two interwound helixes may be on the order from about 1 micron to about 40 micron, preferably from about 10 micron to about 30 micron, and more preferably about 20 micron. For a 20-micron spacing, the length of lower and upper sections may be about 750 micron.

Figure 17:
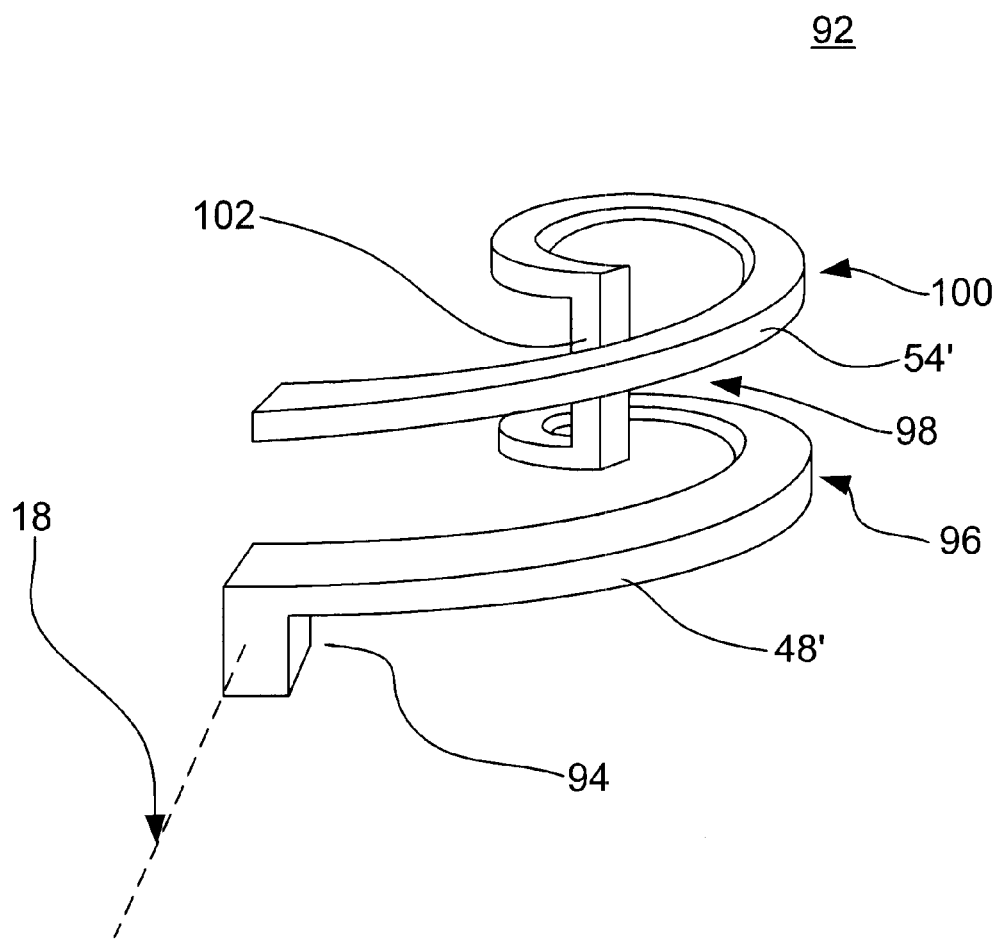
FIG. 17 is an elevational oblique view of a spiral coil inductor.

FIG. 17 is an elevational oblique view of a spiral coil inductor 92 that is made according to the present invention.

Spiral coil inductor 92 is illustrated as a single turn for simplicity and that winds in a counter-clockwise direction, by way of non-limiting example. Additionally, for the spiral coil 92, approximate boundary 18 intersections between a device with an active surface and an inactive surface are set forth. It is also understood that a portion of first seed layer 44 (not pictured) and first conductive trace 48 forms a first filled via 94 (the filled via being first via 42) that connects to a contact 34 as illustrated in FIG. 11. Another portion of first seed layer 44 and first conductive trace 48' forms a lower coil portion 96 as a substantially right spiral body. A middle coil portion 98 is a post-shape that includes structure from second seed layer 56 (not pictured) and second conductive trace 54'. Additionally, an upper coil portion 100 is a substantially right spiral body that includes structure from second seed layer 56 and second conductive trace 54' and comprises a second filled via 102. FIG. 17 is a double coil where, in this instance, each spiral coil has a winding that expands in a clockwise direction.

It is understood that a spiral coil may also be made that has a single-level structure such that essentially a single metal layer in the build-up layer technology is used. Additionally, a spiral coil may be placed above front active surface 20 where the amount of electromagnetic noise that is generated thereby is not disruptive to the functionality of the circuitry within device 36.

Figure 18:
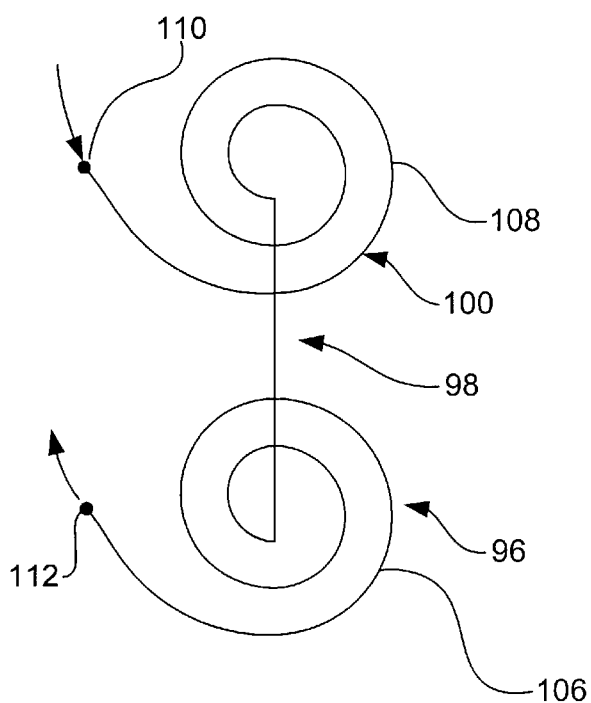
FIG. 18 is an elevational oblique schematic view of a counter coil.
Figure 19:
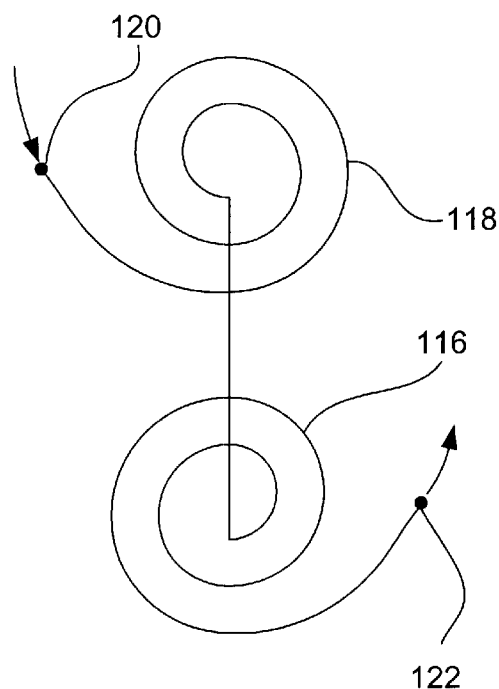
FIG. 19 is an elevational oblique schematic view of a double coil.

FIGS. 18 and 19 illustrate schematic elevational oblique views of a counter coil 104 and double coil 114, respectively. Dielectric layers are not depicted, and they may even be stripped as a final embodiment. A first spiral 106 is made from first conductive trace 48' and optionally from first seed layer 44. A second spiral 108 is made from second conductive trace 54' and optionally from second seed layer 56. A three-dimensional counter coil 104 is formed by the deposition of second conductive trace 54'. The counter coil 104 has current entering from a first terminal 110 into first spiral 106, through the filled via portion of second conductive trace, and exiting second spiral 108 at a second terminal 112. Counter coil 104 is fabricated to allow the B-field that is set up between upper and lower coils, to oppose each other and therefore to potentially cancel each other in effect.

Double coil 114 as depicted in FIG. 19, is fabricated to allow the B-field that is set up between upper and lower coils, to aggregate. Accordingly, a first spiral 116 is made from first conductive trace 48' and optionally from first seed layer 44. A second spiral 118 is made from second conductive trace 54' and optionally from second seed layer 56. A three-dimensional double coil 114 is formed by the deposition of second conductive trace 54'. The double coil 114 has current entering from a first terminal 120 into first spiral 116 through the filled via portion of second conductive trace 54', and exiting second spiral 118 at a second terminal 122. Accordingly, second spiral 118 winds opposite first spiral 116.

Figure 20:
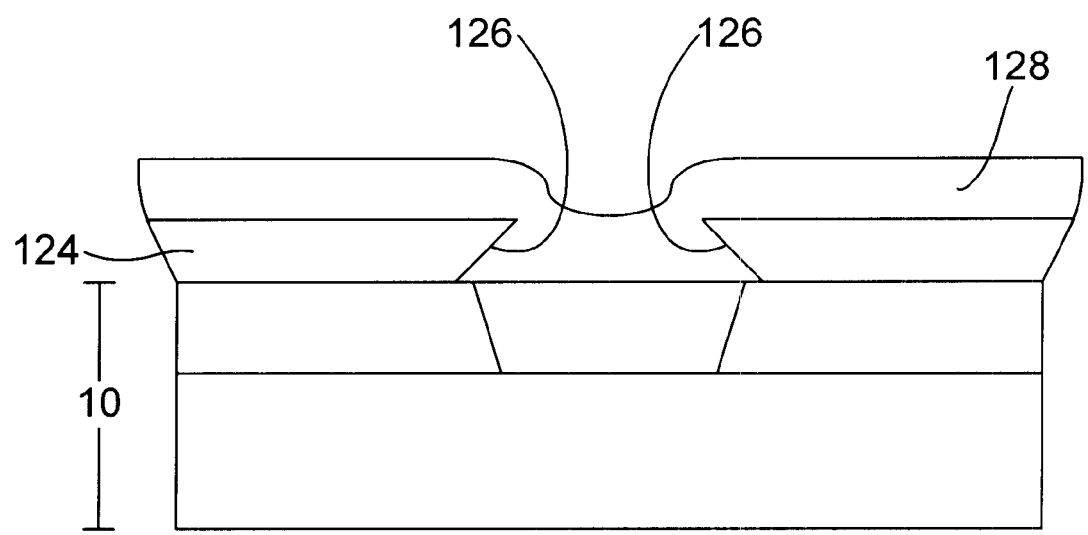
FIG. 20 is an elevational cross-section view of a semiconductor structure that is made according to the present invention.
Figure 21:
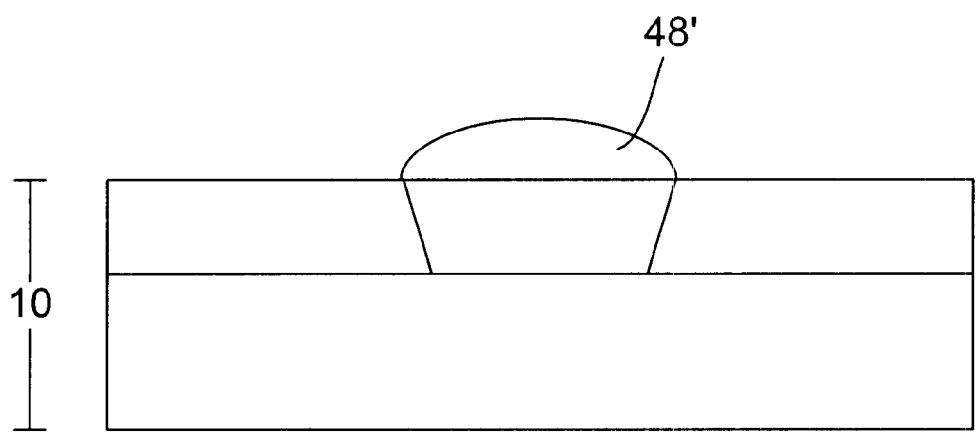
FIG. 21 is an elevational cross-section view of the semiconductor structure depicted in FIG. 20 after further processing.

In all of the above embodiments, fabrication of the inventive inductor may be accomplished by lift-off technology. In this embodiment, the inductor structure may be made by spinning on a first dielectric such as a polymer layer 124 on a substrate 10 and patterning of the polymer layer 124 may be done with a mask wherein patterning is carried out with a wet etch to create an undercut structure 126. Alternatively, polymer layer 124 may be photo active. Thereafter, deposition such as a copper layer 128 is accomplished as depicted in FIG. 20. At the site of undercut 126 on the mask, adhesion of copper layer 128 to substrate 10 such as to a contact in a dielectric layer, will only occur where the copper is bonded to another electrically conductive structure as depicted in FIG. 21 to form a first conductive trace 48'. Additional layers are made by repeating the wet-etch patterning of successive polymer layers to form at least a first conductive trace 48' and a second conductive tract 54'.

In all of the above embodiments, it is understood that either helical or spiral inductors may be fabricated at boundary 18. However, where the amount of noise that the inductor may generate is not disruptive of the proper function of circuitry on front active surface 20, such an inductor may be fabricated above front active surface 20. Two possible constraints for fabricating an inventive inductor above front active surface 20 are space available and a nondisruptive noise level.

Another aspect of the present invention relates to the specific time that the inventive inductors are fabricated. For example by use of wafer-scale packaging technology, the inventive process may be carried out before singulation of the individual packages. Additionally, the inventive process may be employed with making the inventive inductors upon a separate inactive substrate that may be electrically connected to the device by a technique such as flip chip packaging. In this manner, the inventive process may be employed both by build-up layer technology for components that are on separate inactive surfaces that are flip-chip bonded. In combination therewith, other components may be located also on either the active surface or the inactive surface at or near boundary 18. On other words, the inventive inductors or one type of them, may be found in any or all of a flip chip configuration to front active surface 20; upon front inactive surface 22; or in the build up layer above front active surface 20.

Figure 22:
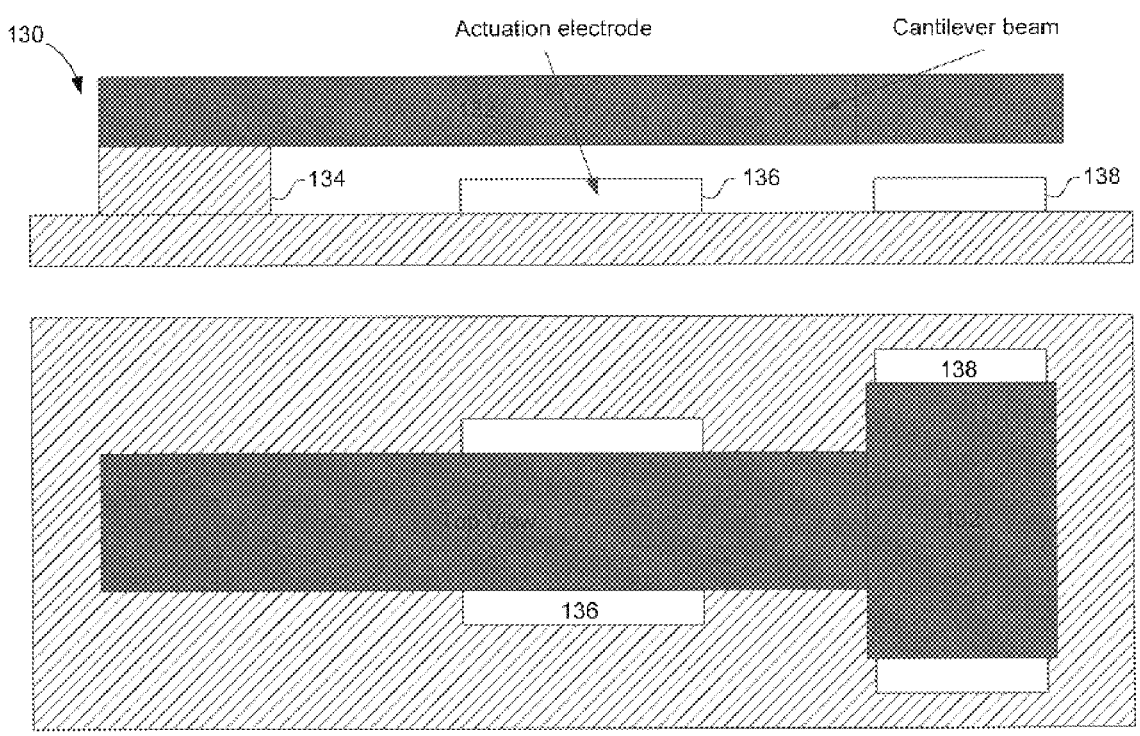
FIG. 22 illustrates a cantilever beam switch according to the present invention.

In accordance with the present invention, MEMS switches are added to the helical inductors to form a tunable inductor. Specifically, turning to FIG. 22, a cantilever beam switch 130 is shown. The cantilever beam switch 130 includes a cantilever beam 132 that has one end anchored to an anchor support 134. An actuation electrode 136, when activated will cause the cantilever beam 132 to move downward and contact switch 138. The switch 130 is adapted to be actuated electrostatically. The actuation electrode 136, in an off state, has no voltage applied. Therefore, the cantilever beam 132 is not attracted to the actuation electrode 136. When an appropriate DC voltage is applied to the actuation electrode 136, the cantilever beam 132 is deflected by electrostatic forces, causing the cantilever beam 132 to deflect downward to be in contact with contact switch 138. When the voltage is removed from the actuation electrode 136, the cantilever beam 132 returns to its static position as shown in FIG. 22 due to the restoring mechanical forces in the cantilever beam 132.

Figure 23:
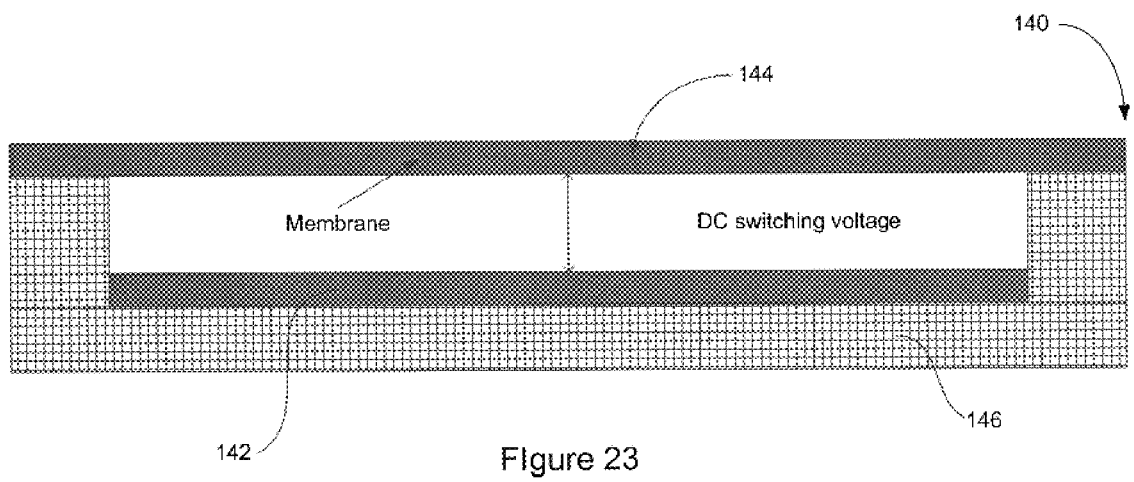
FIG. 23 illustrates a membrane switch according to the present invention.

FIG. 23 illustrates a MEMS membrane switch 140 that may also be used in the present invention. The MEMS switch 140 includes a fixed charge plate 142 and a flexible switch plate 144. A substrate 146 supports the fixed charge plate 142. In operation, a DC switching voltage is applied to the charge plate 142 which will cause electrostatic forces to attract the flexible switch plate 144 downward and in contact with the fixed charge plate 142. This action closes the switch. When the DC switching voltage is removed from the charge plate 142, the flexible switch plate 144 returns to its static position and the switch is considered off.

The MEMS switches described in FIGS. 22 and 23, and indeed other types of MEMS switches, may be used in connection with the helical and spiral inductors described above to form a tunable inductor as further detailed below.

Figure 24:
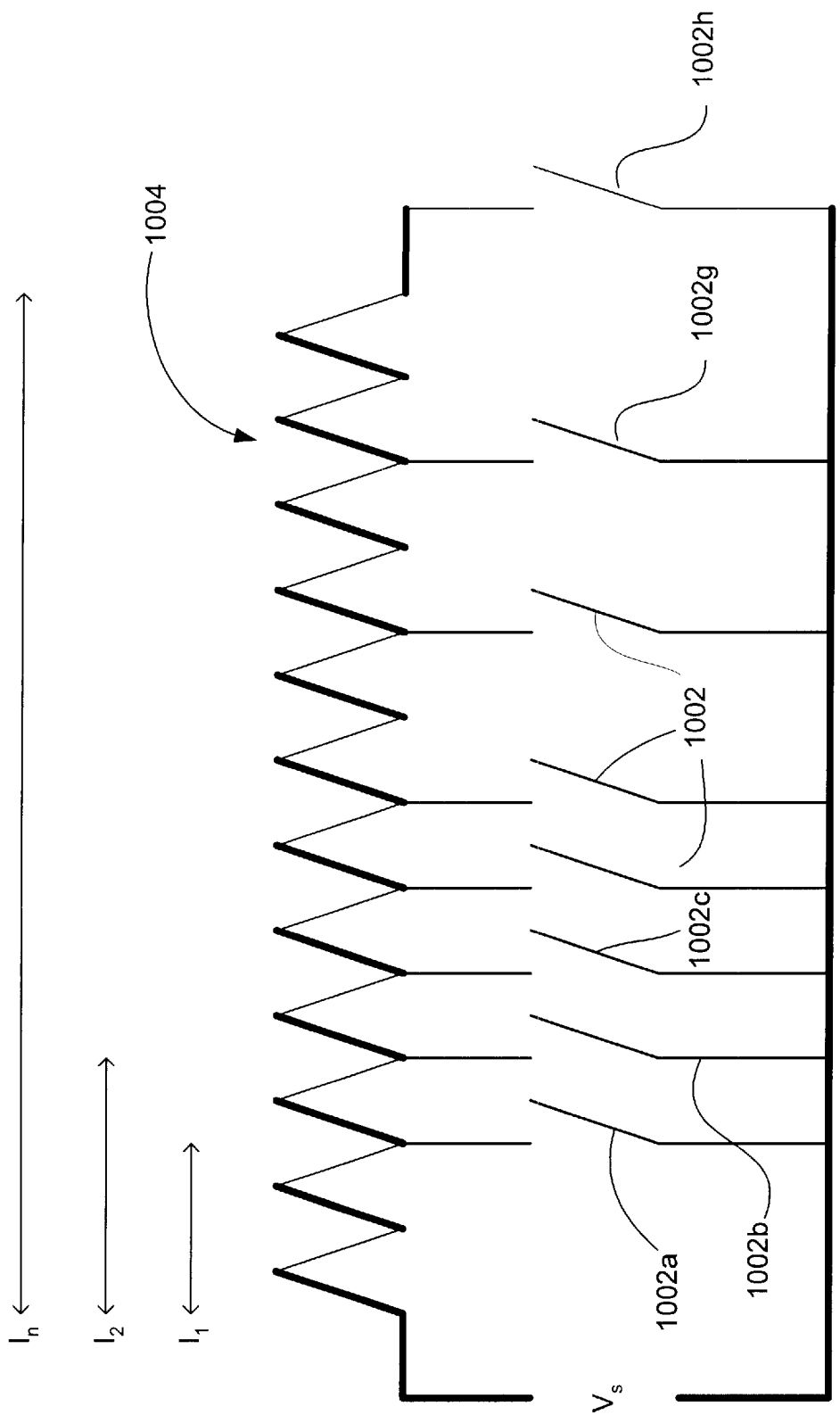
FIG. 24 is a schematic view of a tunable helical inductor using MEMS switches according to the present invention.

FIG. 24 illustrates how a helical inductor may be formed having a plurality of switches 1002 connected to various points of the inductor 1004. The switches 1002 may of the type described in FIGS. 22 and 23. The inductor 1004 may be of the helical type described in connection with FIGS. 1–21. Returning to FIGS. 13 and 14, the helical inductor is shown in isometric oblique view and in schematic view, respectively. The MEMS switches 1002 can be connected to any of the unit cells 60 of the helical inductor. The number of MEMS switches 1002 and where they are connected to the helical inductor 1004 is arbitrary and can be chosen to provide the desired amount of tunablity.

As seen in FIG. 24, the inductance of the inductor 1004 can be increased by turning on the MEMS switch that allows for the largest inductor 1004; in the case of FIG. 24, switch 1002h is turned on. Because switch 1002h is located at the full length of the inductor 1004, switch 1002h is also referred to as the full inductance switch. The remaining switches are turned off. For example, if an inductance $I_1$ is desired, the first MEMS switch 1002a is closed while the other MEMS switches are left open. The MEMS switches 1002a–g are located at intermediate locations along the full length of the inductor 1004. When one of these switches is closed, this provides an electrical circuit that has a relatively small helical inductor 1004. Alternatively, if an inductance value of $I_2$ is desired, the second MEMS switch 1002b is closed and the remaining MEMS switches are all off. In operation, at any point, only one of the MEMS switches 1002 is turned on while all of the remaining MEMS switches are turned off.

Figure 25:
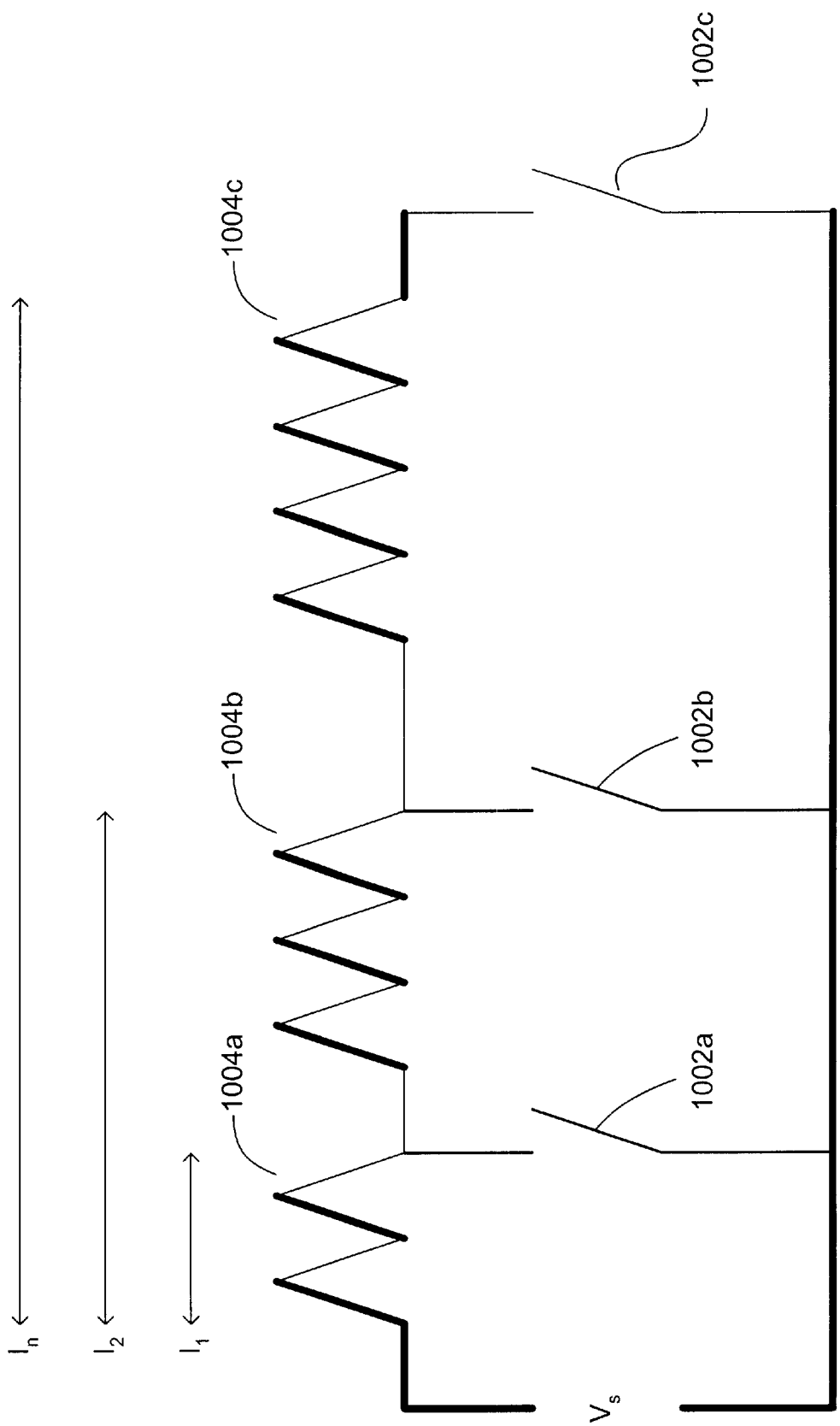
FIG. 25 is a schematic view of a tunable helical inductor having physically separated segments and using MEMS switches according to the present invention.

FIG. 25 shows an alternative embodiment of the present invention where discreet segments of the inductor 1004 are physically separated. For example, a portion of a metal interconnect may be used to separate the discrete segments. However, other conductive structures may also be used, preferably, the conductive structures being non-helical. This allows for the reduction of Eddy current. Thus, in FIG. 25, there are three discrete helical inductors 1004a, 1004b, and 1004c. Similarly, there are three MEMS switches that activate each portion of the inductor 1004. The MEMS switches 1002a, 1002b, and 1002c are selectively closed in the same manner as shown in FIG. 24. Thus, only one of the MEMS switches is closed at any time, depending upon the amount of inductance needed.

Figure 26:
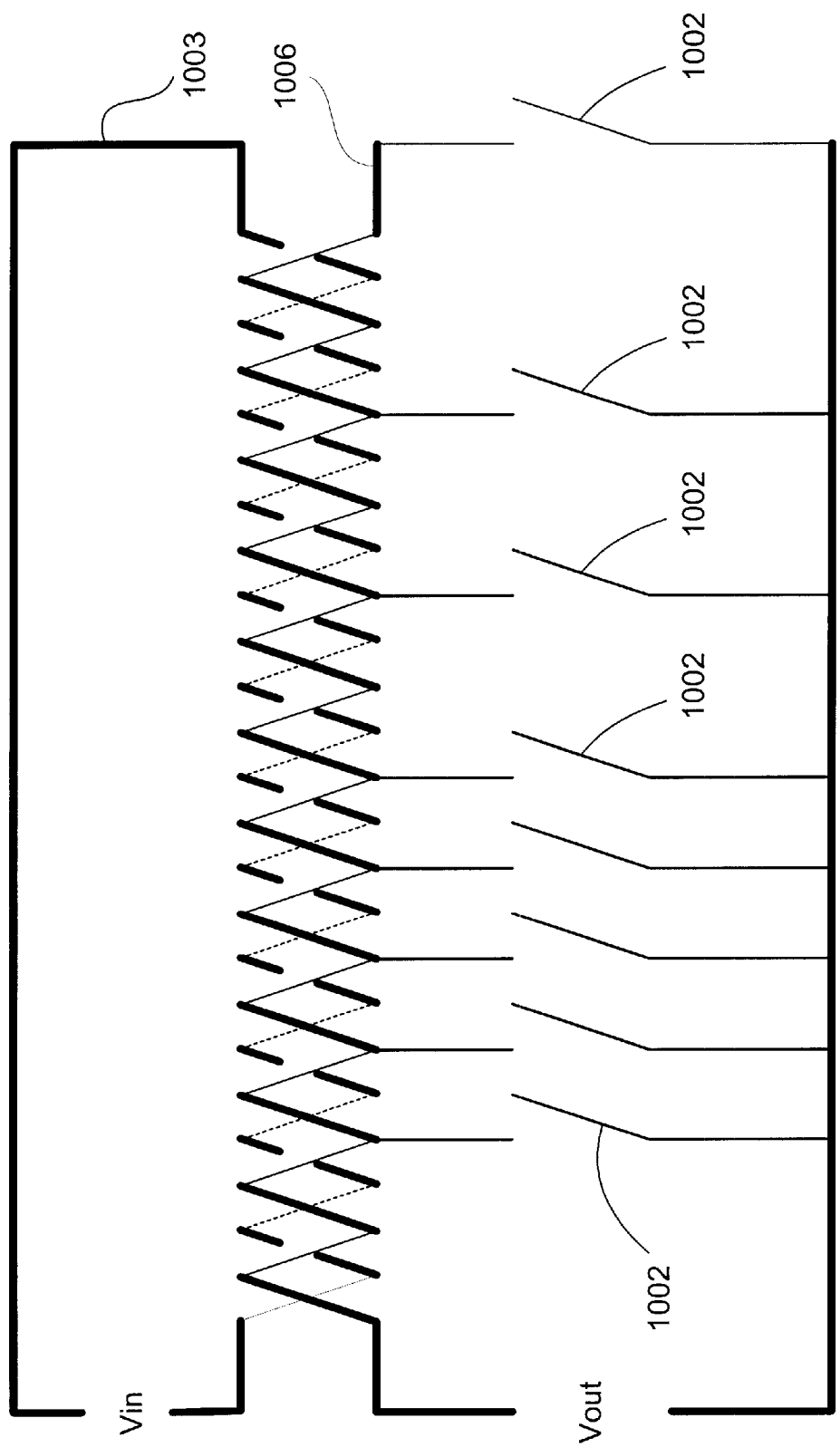
FIG. 26 is a schematic view of a tunable transformer using MEMS switches according to the present invention.

The tunable inductor as disclosed herein can be used in a variable transformer as seen in FIG. 26. As noted above with respect to FIGS. 15 and 16, two interwound helical inductors can form a transformer. Specifically, in FIG. 26, a primary helical inductor 1003 (shown in dashed lines) is interwound with a secondary helical inductor 1006. By having MEMS switches 1002 attach at different portions of the secondary helical inductor 1006, the transformer ratio can be changed by activating one of the MEMS switches 1002. In other words, the secondary helical inductor 1006, shown by the solid lines, can be divided into many segments by the MEMS switches 1002. The various segments can be of different lengths corresponding to various inductances. By activating certain of the MEMS switches 1002, with all of the other MEMS switches off, a desired output voltage is obtained.

Figure 27:
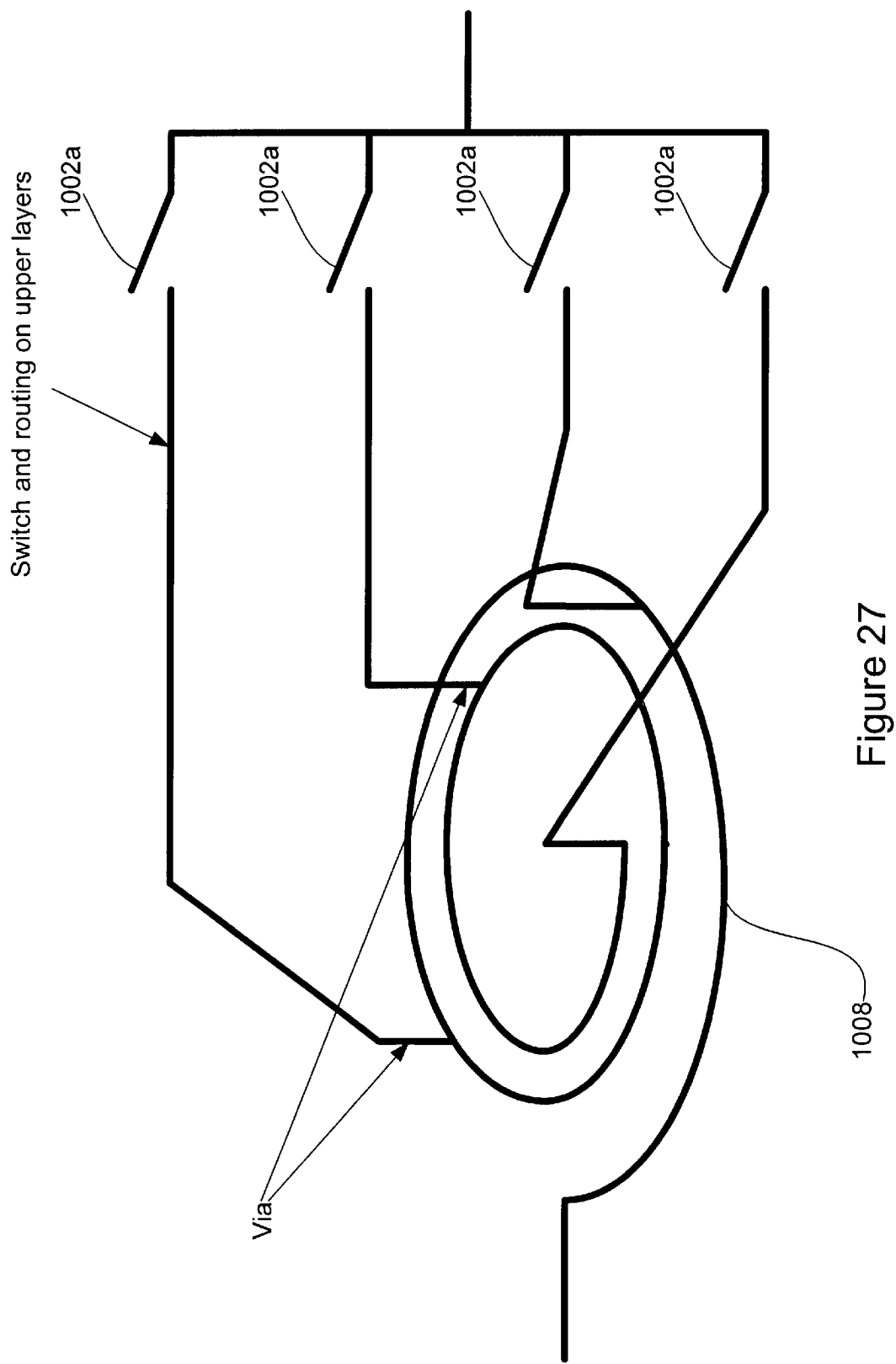
FIG. 27 is a schematic view of a tunable spiral coil inductor using MEMS switches according to the present invention.

Using the same concepts described above with respect to helical inductors, a spiral inductor may be modified so that it is tunable. In particular, turning to FIG. 27, a spiral coil inductor 1008 may have MEMS switches connecting at various locations along the spiral of the coil inductor 1008. The MEMS switches 1002 can be selectively activated to provide a larger inductance or a smaller inductance. In operation, only one of the MEMS switches 1002 is on while all of the remaining MEMS switches are turned off. If the full inductance of the spiral inductor 1008 is desired, the switch 1002d is turned on and the remaining switches are turned off. However, if only an intermediate value of inductance is desired, then one of the other switches 1002a–c is turned on, while the remaining switches are turned off.

Figure 28:
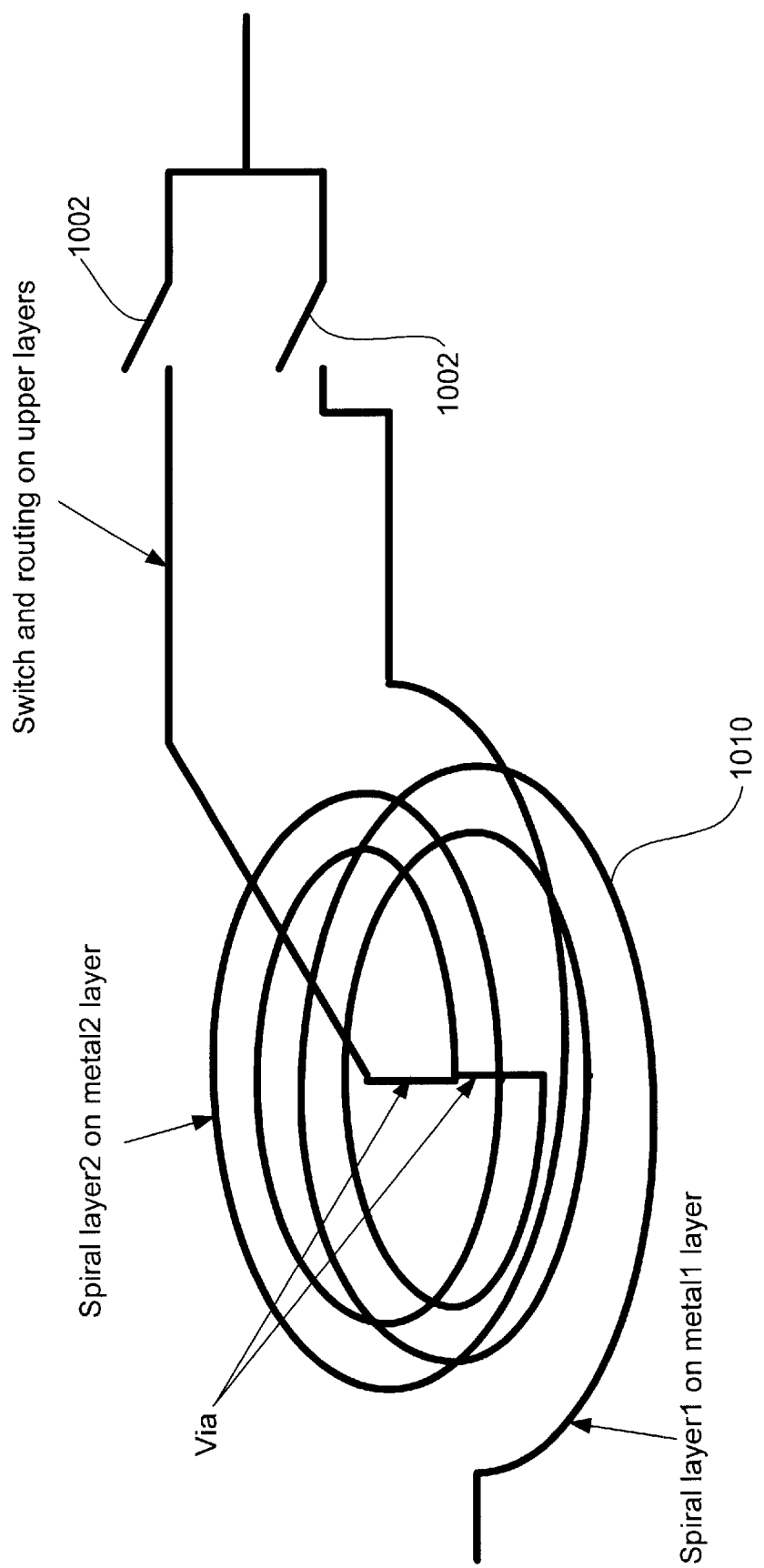
FIG. 28 is a schematic view of a tunable multi-layer spiral coil inductor using MEMS switches according to the present invention.
Figure 29:
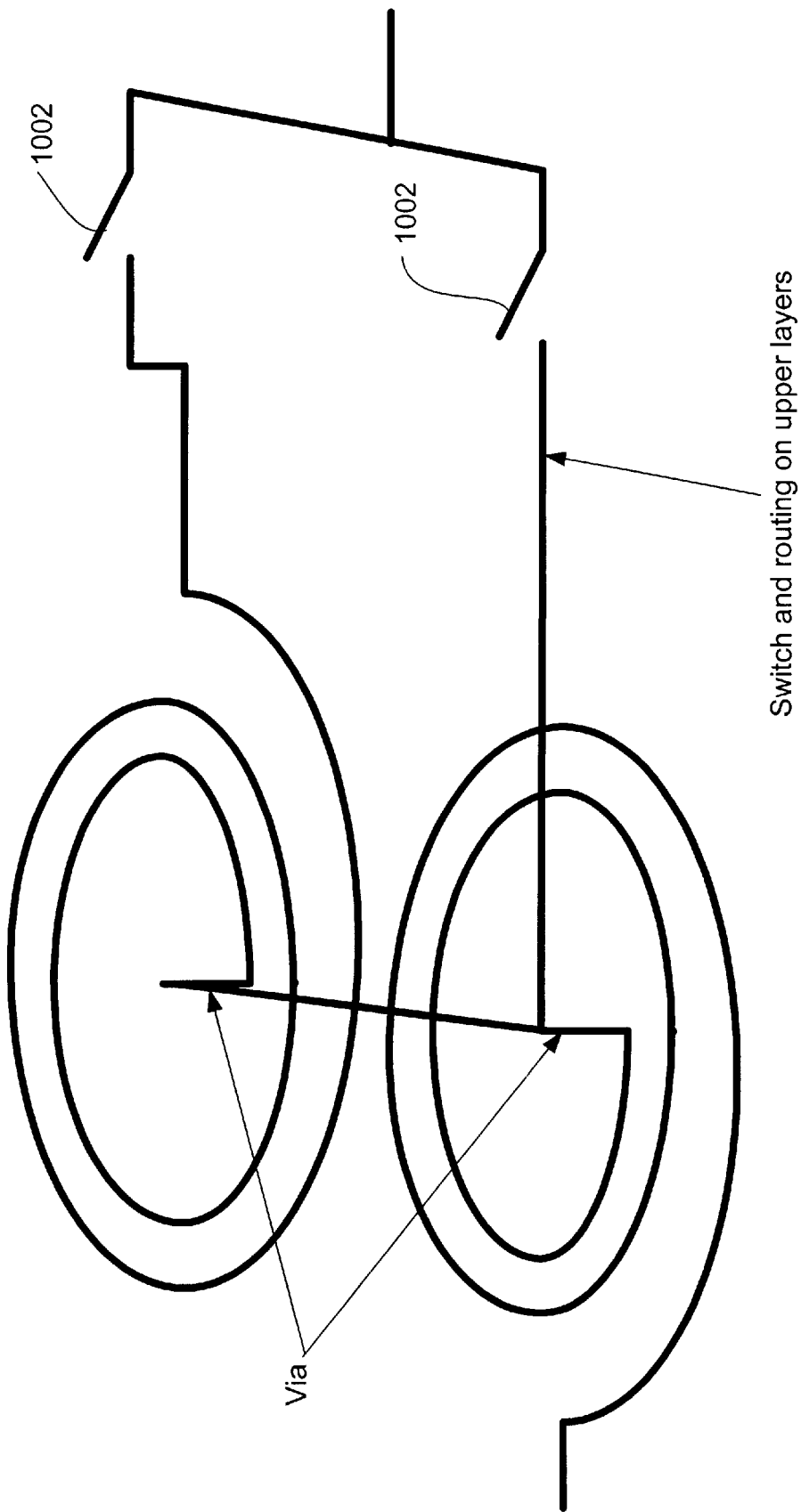
FIG. 29 is a schematic view of a tunable multiple spiral coil inductor using MEMS switches according to the present invention.

Turning to FIG. 28, concepts of a tunable inductor of the present invention can also be applied to a multiple layer spiral coil inductor 1010. By turning on one of the MEMS switches 1002 and turning off all of the other MEMS switches 1002, a desired inductance can be obtained. Further, turning to FIG. 29, multiple spiral coils of the same inductance or different inductance can also be used individually or combined. Specifically, by turning one of the MEMS switches 1002 on with all of the other MEMS switches off, a desired inductance may be obtained.

It will be readily understood to those skilled in the art that various other changes in the details, material, and arrangements of the parts and process stages which have been described and illustrated in order to explain the nature of this invention may be made without departing from the principles and scope of the invention as expressed in the subjoined claims.

What is claimed is:

1. A tunable inductor comprising:
    a helical inductor formed on a semiconductor substrate having an input and an output, said helical inductor having a full length that provides a full inductance;
    a full inductance switch disposed between said output and said full length of said helical inductor; and
    at least one microelectromechanical (MEMS) switch disposed between said output and an intermediate location of said helical inductor.
2. The inductor of claim 1, wherein said MEMS switch is a membrane switch.
3. The inductor of claim 1, wherein said MEMS switch is a cantilever beam switch.
4. The inductor of claim 1, wherein said helical inductor has at least two segments that are separated by a non-helical structure, wherein said intermediate location is at said non-helical structure.
5. The inductor of claim 1, wherein said helical inductor is substantially a two-dimensional, spiral structure.
6. The inductor of claim 5 wherein said substantially two-dimensional, spiral structure, comprises at least two layers of electrically conductive material, wherein the at least two layers of electrically conductive material comprise a first conductive trace and a second conductive trace.
7. The inductor of claim 1, wherein said spiral inductor is substantially a single-layer, spiral structure.
8. A tunable inductor comprising:
    a spiral inductor formed on a semiconductor substrate having an input and an output, said spiral inductor having a full length that provides a full inductance;
    a full inductance switch disposed between said output and said full length of said spiral inductor; and
    at least one microelectromechanical (MEMS) switch disposed between said output and an intermediate location of said spiral inductor.
9. The inductor of claim 8, wherein said MEMS switch is a cantilever beam switch.
10. The inductor of claim 8, wherein said MEMS switch is a membrane switch.
11. The inductor of claim 8 wherein said substantially spiral inductor comprises at least two layers of electrically conductive material, wherein the at least two layers of electrically conductive material comprise a first conductive trace and a second conductive trace formed into a spiral and said first conductive trace is substantially above said second conductive trace.
12. The inductor of claim 11 wherein said first conductive trace and said second conductive trace is connected by a via and said at least one MEMS switch is connected to said via.
13. The inductor of claim 8 wherein said substantially spiral inductor comprises at least two layers of electrically conductive material, wherein the at least two layers of electrically conductive material comprise a first conductive trace and a second conductive trace formed into a spiral and said first conductive trace is adjacent to said second conductive trace.
14. The inductor of claim 13 wherein said first conductive trace and said second conductive trace is connected by a via and said at least one MEMS switch is connected to said via.
15. A tunable transformer comprising:
    a first helical coil formed on a semiconductor substrate;
    a second helical coil formed on a semiconductor substrate having an input and an output, said second helical coil having a full length that provides a full inductance, said second helical inductor interwound with said first helical coil;
    a full transformer switch disposed between said output and said full length of said second helical coil; and
    at least one microelectromechanical (MEMS) switch disposed between said output and an intermediate location of said second helical coil.
16. The transformer of claim 15, wherein said first helical coil is would in a first spiral direction and said second helical coil is wound opposite the first spiral direction.
17. The transformer of claim 16 wherein:
    said first and second helical coils comprise at least two layers of electrically conductive material, wherein the at least two layers of electrically conductive material comprise a first conductive trace and a second conductive trace.

\* \* \* \* \*